(12) United States Patent
Yang

(10) Patent No.: US 8,294,298 B2
(45) Date of Patent: Oct. 23, 2012

(54) REDUNDANT POWER SUPPLY DEVICE

(75) Inventor: Shang-Sheng Yang, Shulin (TW)

(73) Assignee: Portwell Inc., Shulin, Taipei County (TW)

( * ) Notice: Subject to any disclaimer, the term of this patent is extended or adjusted under 35 U.S.C. 154(b) by 343 days.

(21) Appl. No.: 12/696,519

(22) Filed: Jan. 29, 2010

(65) Prior Publication Data
US 2011/0187188 A1    Aug. 4, 2011

(51) Int. Cl.
*H02J 9/00* (2006.01)
*H05K 5/00* (2006.01)

(52) U.S. Cl. .......................................... 307/64; 361/731

(58) Field of Classification Search ................ 307/31, 307/64; 361/731
See application file for complete search history.

(56) References Cited

U.S. PATENT DOCUMENTS

| 7,423,871 B2* | 9/2008 | Schwab | 361/695 |
| 7,460,367 B2* | 12/2008 | Tracewell et al. | 361/679.48 |
| 2008/0278898 A1* | 11/2008 | Huang | 361/683 |
| 2008/0309160 A1* | 12/2008 | Gibson et al. | 307/11 |

\* cited by examiner

*Primary Examiner* — Michael Rutland Wallis
(74) *Attorney, Agent, or Firm* — Muncy, Geissler, Olds & Lowe, PLLC

(57) ABSTRACT

A redundant power supply device, particularly the one without installing a heat dissipating fan, includes a chassis having at least one power input accommodating space and a plurality of power output accommodating spaces, a back panel device comprising a back panel, which is a printed circuit board mounted onto the chassis, a plurality of power supply devices installed in the power output accommodating spaces and electrically connected to the back panel, at least one power input module inserted into the power input accommodating space for providing an external AC-to-DC or DC-to-AC conversion and electrically coupling the back panel. During an application without changing the back panel, the power input accommodating space is disposed opposite to the external input power supply, and the power input includes at least one power input module with AC-to-DC or DC-to-AC conversion to achieve high interchangeability, economic benefit and product competitiveness.

11 Claims, 8 Drawing Sheets

REDUNDANT POWER SUPPLY DEVICE

BACKGROUND OF THE INVENTION

1. Field of the Invention

The present invention relates to a power supply device structure, and more particularly to a redundant power supply device without installing a heat dissipating fan, and the power supply device comes with a swappable AC or DC power input, operates together with an external input power supply, and provides a convenient modular installation.

2. Description of the Related Art

As the design of a redundant power supply module device available in the present power supply market generally comes with a redundant application of N+1 power supply devices and uses a plurality of hot swappable power supply devices to achieve the aforementioned function. If any one of the power supply devices in the redundant power supply module fails, a backup power supply device can take over the power supply function to prevent errors occurred during the operation of a computer system due to a power failure, and the defective power supply device is hot swappable without the need of turning off a computer system.

However, the redundant power supply devices of this sort can be applied as a single-mode external input power supply such as an AC input or a DC input only. Since the power input comes with a fixed mode and cannot be switched, therefore it is necessary to manufacture two separate redundant power supply devices for both the AC and DC inputs, and the conventional power supply devices incur higher manufacturing cost and management cost. Obviously, the conventional redundant power supply devices require improvements.

Some electronic components installed in the power supply device may be overheated during their operation. As the using time increases and the heat cannot be eliminated effectively, the normal operation of the power supply device will be affected and thus the heat dissipation issue becomes important. Although present existing single power supply devices or redundant power supply devices come with the design of a heat dissipating fan for adjusting the temperature of the power supply devices or redundant power supply devices, yet the effect is not significant or effective sometimes, particularly for a long time of use. Besides the production of noises, the conventional power supply devices also fails to achieve the effect of lowering the temperature to a predetermined temperature. Furthermore, the use of the heat dissipating fan increases the volume of the power supply device and consumes additional electric power. In the power supply device having a chassis with a smaller size specification (such as the specification having height*width*depth equal to 150 mm*86 mm*N mm, +10 mm; wherein N is a depth without any specific limitation), the present existing redundant power supply devices can accommodate 1+1 power supply devices only. If it is necessary to provide an output of 3+1 (or more) power supply devices, another chassis will be required to accommodate extra power supply devices, and the volume efficiency cannot be improved effectively.

In view of the shortcomings of the prior art, the inventor of the present invention based on years of experience in the related industry to conduct extensive researches and experiments, and finally developed a modular swappable redundant power supply device with the advantages of power input interchangeability, modular convenience, effective increased volume efficiency and better heat dissipation without the need of installing a heat dissipating fan to overcome the shortcomings of the prior art.

SUMMARY OF THE INVENTION

Therefore, it is a primary objective of the present invention to overcome the aforementioned shortcoming and deficiency of the prior art by providing a redundant power supply device in accordance with the present invention, such that an external power input has the function of a modular assembling and provides a swappable and interchangeable application to achieve the advantages of flexible manufacturing, assembling and application, so as to enhance the economic benefits and product competitiveness.

Another objective of the present invention is to reduce the volume of the redundant power supply device effectively, such that the chassis of the redundant power supply device with a smaller size specification (such as the specification having height*width*depth equal to 150 mm*86 mm*N mm, +10 mm, wherein N is a longitudinal depth with any specific limitation) can provide an output of 3 or more power supply devices to meet the connection requirements of various different electric devices selectively.

A further objective of the present invention is to provide a redundant power supply device with modular package and high heat dissipation, such that the chassis or the power supply device can have an excellent heat dissipating efficiency without the need of installing a heat dissipating fan to assure the function and safety of the application.

To achieve the foregoing objective, the present invention provides a redundant power supply device comprising: a chassis, the chassis includes a containing space partitioned into at least one power input accommodating space and a plurality of power output accommodating spaces; a back panel device, comprising a back panel which is a printed circuit board mounted onto the chassis, and a corresponding back panel connector disposed on the back panel and at a position corresponding to the containing space; a plurality of power supply devices installed in the power output accommodating space for supplying an output power, and each having a power supply connector coupled to the back panel connector; at least one power input module, inserted into the power input accommodating space electrically connected to the back panel for providing an AC-to-DC or DC-to-AC conversion function, such that the power input accommodating space together with the external input power supply provide an application of the power input module having a selective swappably AC/DC or DC/DC conversion function without the need of changing the back panel.

To achieve the foregoing objective, the present invention provides a redundant power supply device comprising: a chassis with a smaller size specification (such as the specification having height*width*depth equal to 150 mm*86 mm*N mm, +10 mm, wherein N is a longitudinal depth without any specific limitation), and a power input module having a power input of 3+1 power supply devices with a selectively AC/DC or DC/DC conversion function; or a power input of a power input modules having a selectively AC/DC or DC/DC conversion function and an output of 2+1 power supply devices.

The aforementioned and other objectives and technical characteristics of the present invention will become apparent with the detailed description of the preferred embodiments and the illustration of related drawings as follows.

DETAILED DESCRIPTION OF THE PREFERRED EMBODIMENTS

Figure 1:
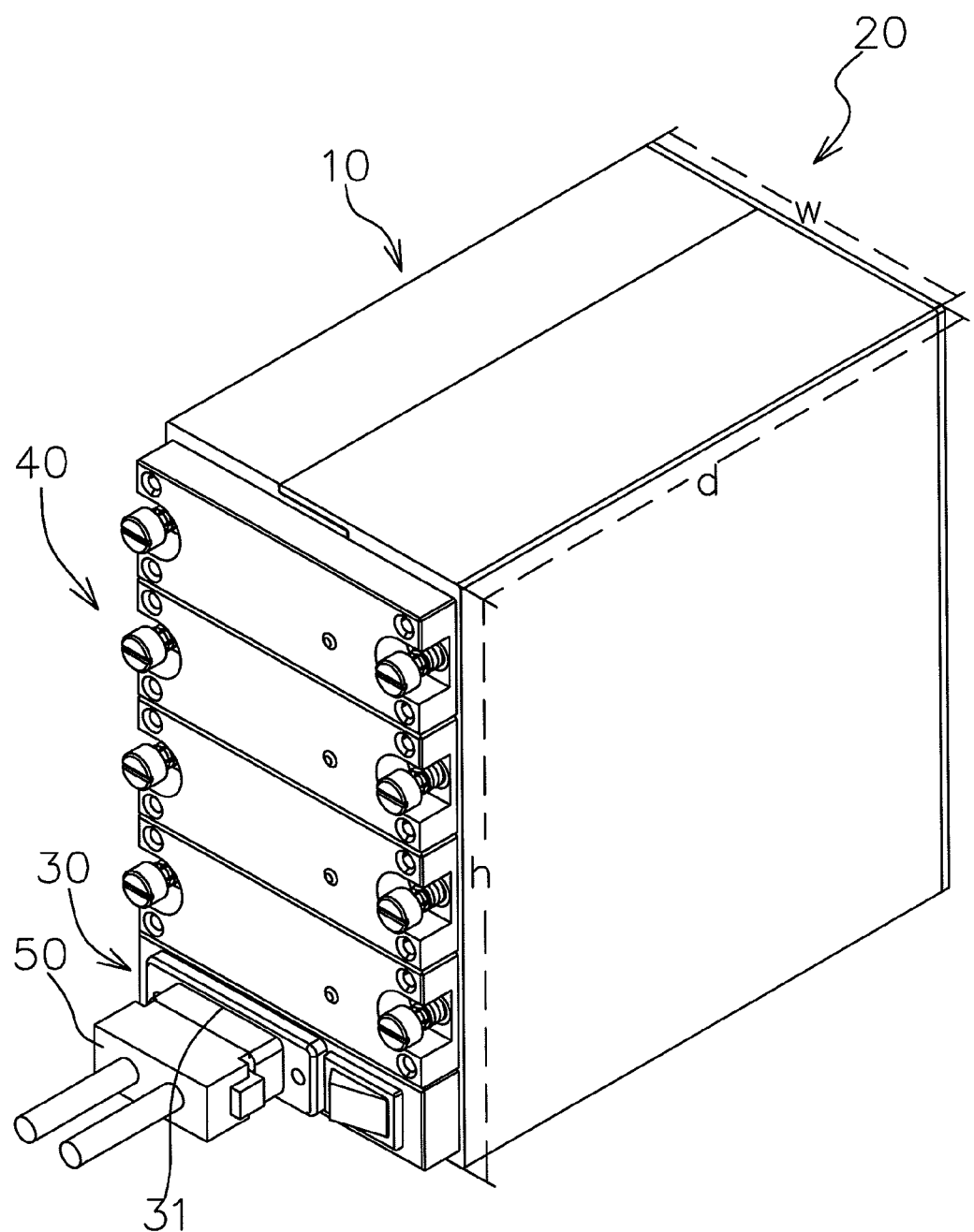
FIG. 1 is a perspective front view of a first preferred embodiment of the present invention.
Figure 2:
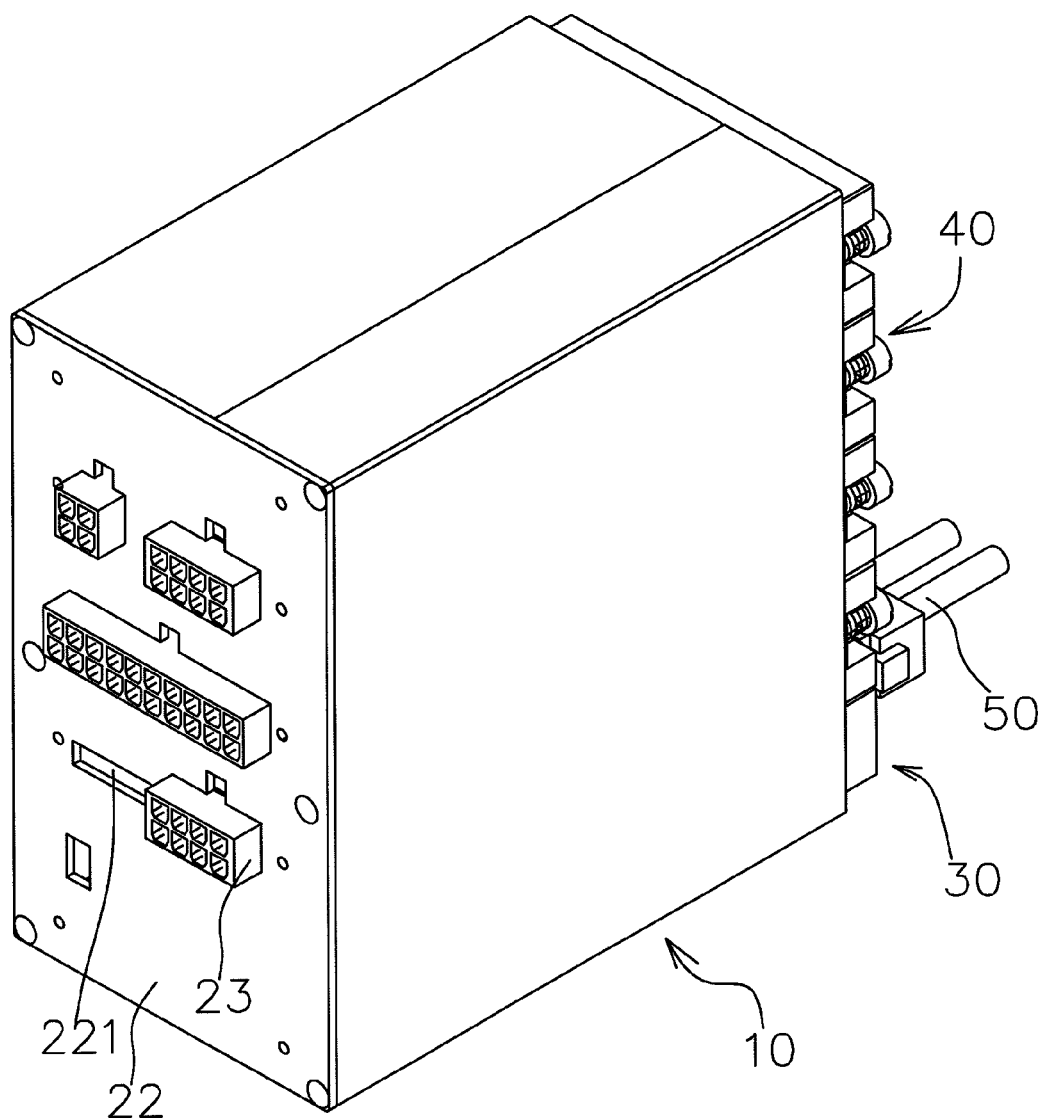
FIG. 2 is a perspective rear view of a first preferred embodiment of the present invention.
Figure 3:
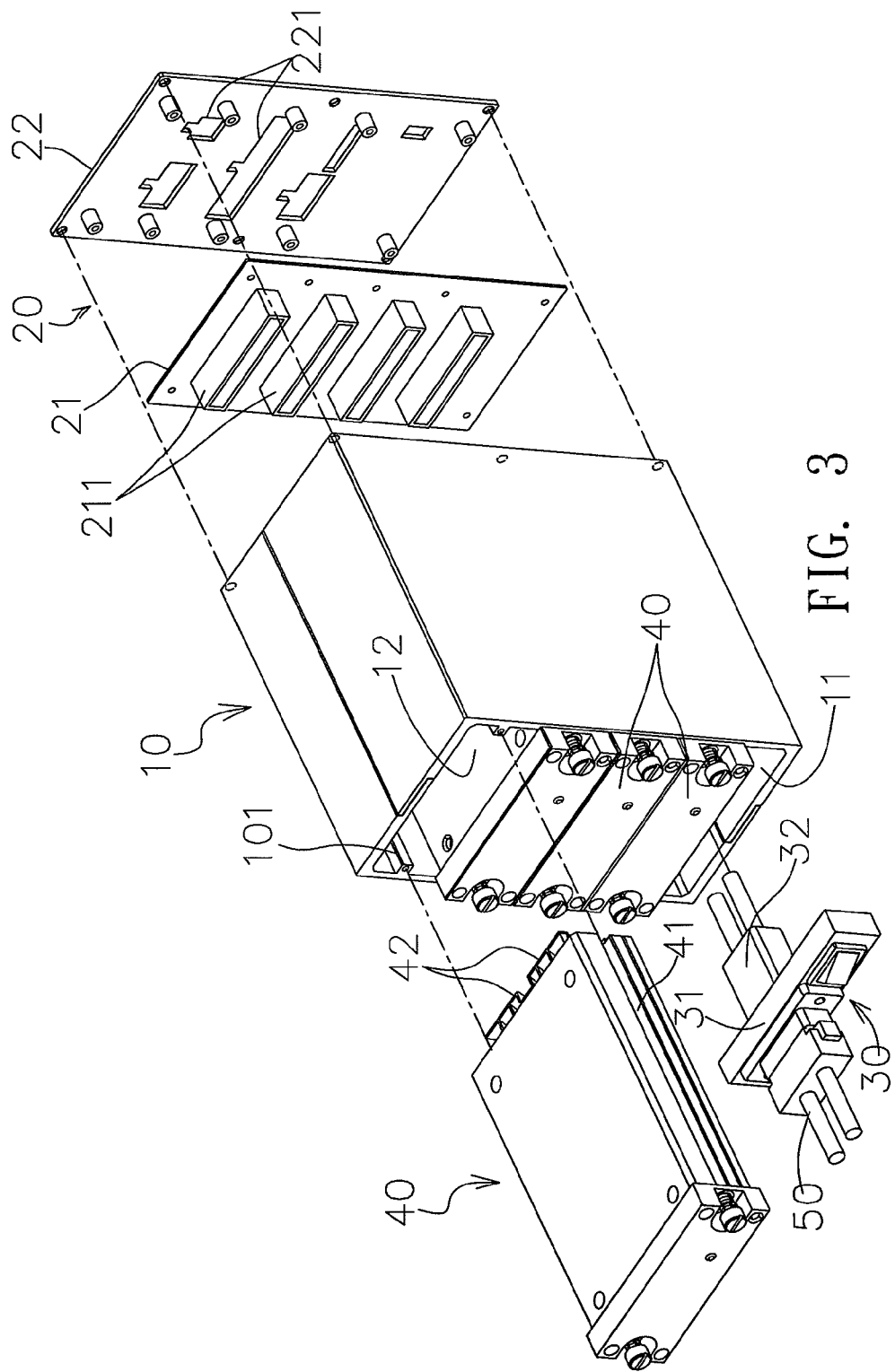
FIG. 3 is an exploded view of a first preferred embodiment of the present invention.

With reference to FIGS. 1 to 3 for a redundant power supply device in accordance with a first preferred embodiment of the present invention, the redundant power supply device, particularly the one without installing a heat dissipating fan, comprises a chassis 10, a back panel device 20, a power input module 30 and a plurality of power supply devices 40.

The chassis 10 includes a containing space formed therein and partitioned into a power input accommodating space 11 and a plurality of power output accommodating spaces 12 (wherein there are 3+1 power output accommodating spaces 12 in this preferred embodiment), and rails 101 disposed on both sides of the chassis 10 and corresponding to the containing spaces (and the size specification of the chassis having height (h)*width (w)*depth (d) is equal to 150 mm*86 mm*N mm, +10 mm in this preferred embodiment, wherein N is a longitudinal depth without any specific limitation).

The back panel device 20 comprises a back panel 21 and an output board 22, and the back panel 21 (such as a printed circuit board) is mounted onto the chassis 10 (or at the rear of the chassis in this preferred embodiment), and the back panel 21 includes a plurality of back panel connectors 211 installed on a side opposite to the chassis 10, and each back panel connector 211 corresponds to each power input accommodating space 11 of the chassis 10 (or the power output accommodating space 12), and the output board 22 is fixed to the back panel 21, and the output board 22 includes a plurality of electric connector slots 221 with various different specifications, and a plurality of electric output connectors 23 corresponding to the plurality of electric connector slots 221 for installing different external electric devices respectively, wherein the electric output connector 23 and the back panel 21 are electrically connected to the corresponding back panel connectors 211. In other words, the output board 22 includes a plurality of various electric output connectors 23 for selectively and conveniently connecting various different electric devices.

The power input module 30 is installed in the power input accommodating space 11 of the chassis 10 (wherein there is one power input module in this preferred embodiment) for providing the function of converting an external AC (such as 110V or 220V) into DC or an external DC (such as 5V~76V) into DC, and the power input module 30 includes a power input conversion circuit 31 and a transmission port 32, and the power input conversion circuit 31 is provided for connecting a power port 50 (which is an external current input source), and the transmission port 32 is electrically connected to the back panel device 20 (or the back panel 21).

If the power port 50 is an AC input port, the power input conversion circuit 31 converts AC into DC to be inputted to the back panel; and if the power port 50 is a DC input port, it is necessary to switch the power input conversion circuit 31 to the DC-to-DC conversion circuit to input the converted DC to the back panel. In other words, the power input of the power input module 30 can be installed in the power input accommodating space 11 with an AC or DC power input module selectively according to the application requirement of an external AC or DC input to meet a user's requirement.

The plurality of power supply devices 40 (wherein there are 3+1 power supply devices in this preferred embodiment) can be respectively and swappably installed in the plurality of power output accommodating spaces 12 of the chassis 10, and the power supply device 40 includes a slide slot 41 disposed on a side of the power supply device 40, and a rail 101 of the power output accommodating space 12 can be installed slidably into the slide slot 41, and a power supply connector 42 is installed at a rear end of the power supply device 40 and connected to the back panel connector 211.

Since the external power input of the conventional redundant power supply device is fixed and limited to a selective use of AC and DC power inputs, the power input module 30 of the present invention is modularized, and the back panel 21 can be shared, therefore a system with only one power supply device is needed, and the AC or DC of the power input module 30 is installed selectively and swappably to allow users to choose the use of a DC input or an AC input. Such arrangement not only provides a more flexible application to the product, but also simplifies the components and lowers the cost of the product.

In addition, the redundant power supply device of the present invention further comprises an electric output connector 23 installed on the back panel 21 to provide a convenient external connection, and the present invention comes with a flexible modular design, a shared back panel, and a selective use of the electric output connector 23, the present invention provides a modular design with an output DC power supply of 3.3V, 5V, +12V, 5VSB for a flexible and convenient application to meet the requirements of connecting different electric devices.

Figure 4:
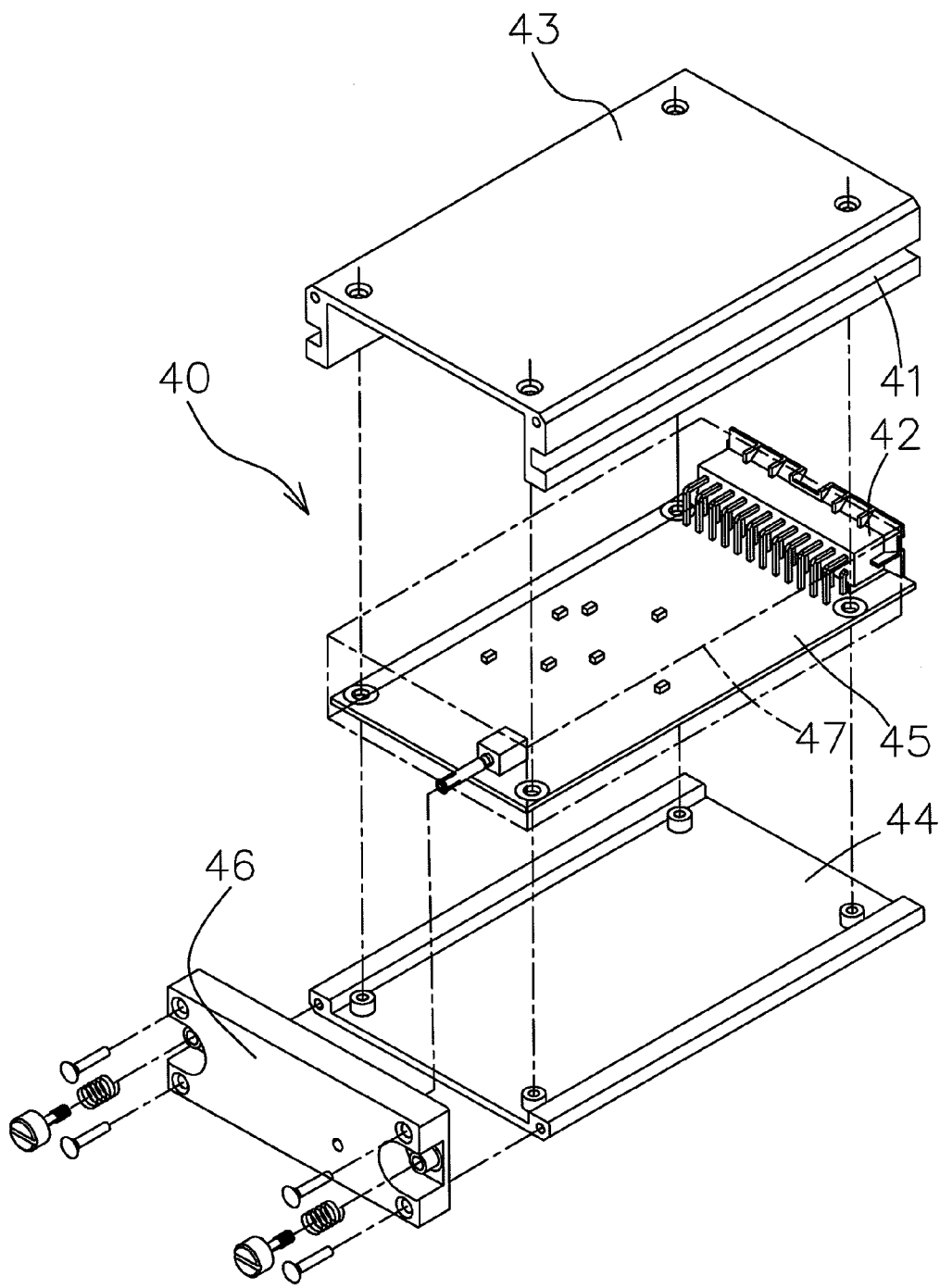
FIG. 4 is an exploded view of a heat dissipation design of a power supply device of the present invention.
Figure 5:
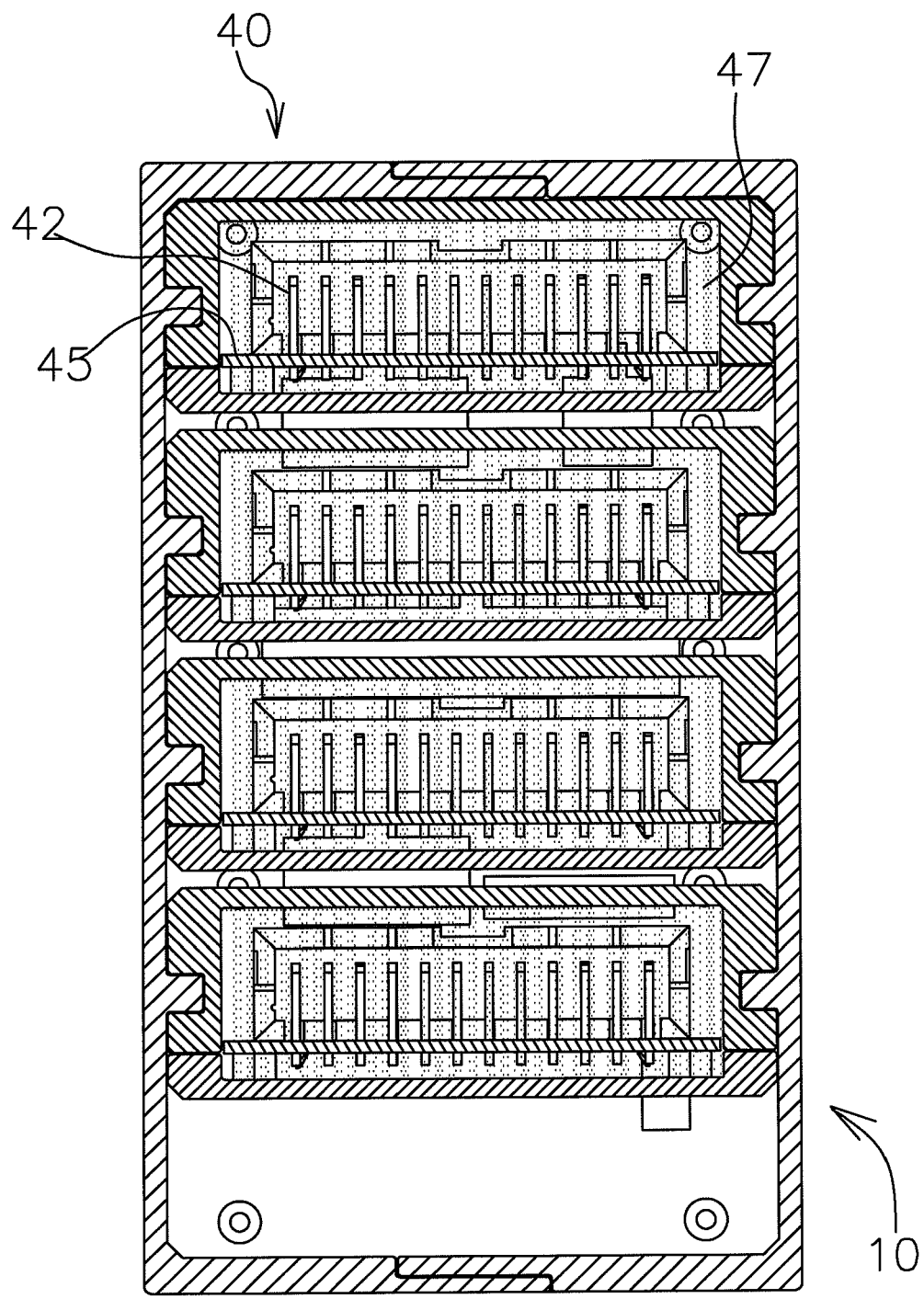
FIG. 5 is a cross-sectional view of a heat dissipation design of a power supply device of the present invention.

With reference to FIGS. 4 and 5, the power supply device 40 of the present invention further comprises an upper casing 43, a lower casing 44, a modular printed circuit board 45 and a front panel 46, wherein the modular printed circuit board 45 includes related electronic component installed thereon and the power supply connector 42 installed at the rear of the modular printed circuit board 45, and the modular printed circuit board 45 and its electronic components (including the power supply connector 42) are packaged by a thermal conductive glue 47, and the thermal conductive glue 47 is attached closely with the upper casing 43, the lower casing 44 and the front panel 46, such that the heat generated by the electronic components in the power supply device 40 can be transmitted through the thermal conductive glue 47 to the upper casing 43, the lower casing 44 and the front panel 46 (which constitute the modular chassis) to enhance the heat dissipating efficiency substantially, so as to overcome the poor heat dissipation of the power supply without installing the heat dissipating fan and reducing the volume of the power supply device 40 effectively.

Figure 6:
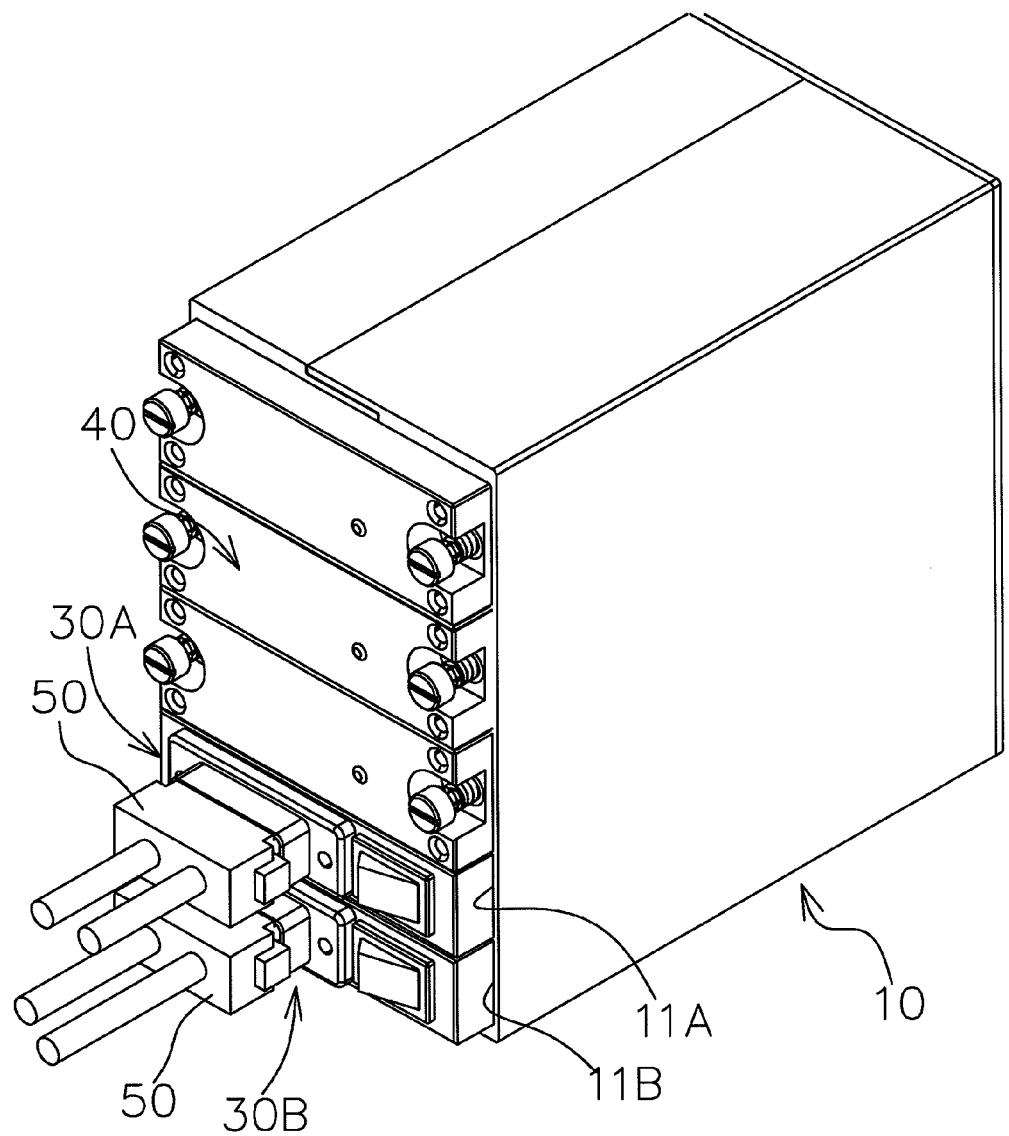
FIG. 6 is a schematic view of a second preferred embodiment of the present invention.

With reference to FIG. 6, the present invention redundant power supply device second preferred embodiment, this embodiment is based on the structural design of the first preferred embodiment and further comprises two power input modules 30A, 30B, which can be AC or DC input modules, and the chassis 10 includes two power input accommodating spaces 11A, 11B, such that the power input module 30A, 30B can provide a modular redundant power input function to facilitate a steady supply of the power input. The number of power supply devices 40 in the chassis 10 with a smaller size specification (such as the specification having height*width*depth equal to 150 mm*86 mm*N mm, +10 mm, wherein N is a longitudinal depth without any specific limitation) is equal to or less than 2+1.

Figure 7:
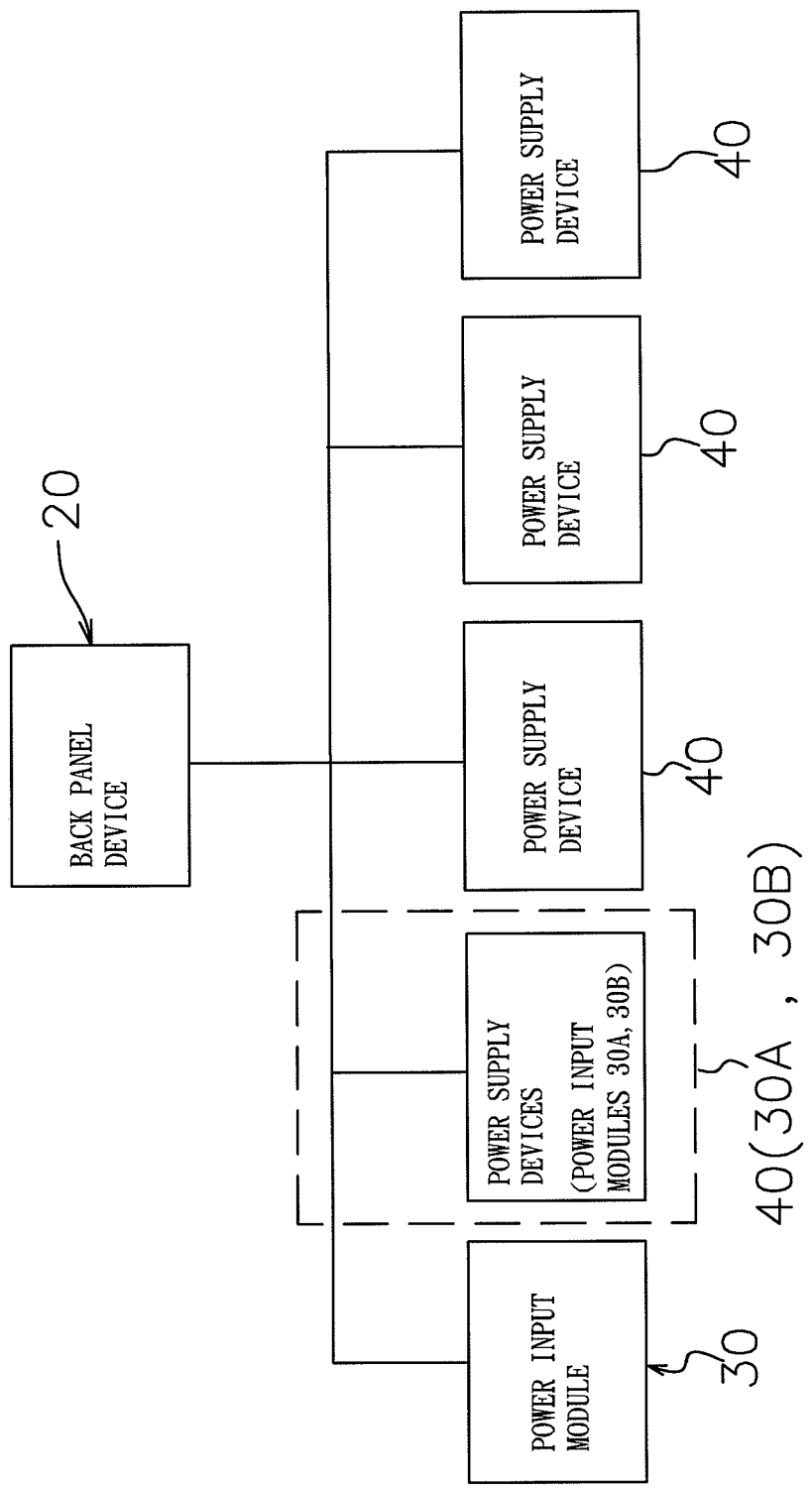
FIG. 7 is a schematic view of electrically coupling a redundant power supply device of the present invention.

In the aforementioned structure, the redundant power supply devices of the present invention share one back panel 21 for an AC or DC input module. In FIG. 7, if the present invention has a power input module 30 (either DC or AC power input module), the power input module 30 is connected to the plurality of power supply devices 40 and jointly and electrically coupled to the back panel 21, and the back panel 21 is provided for the final power output. If there are two power input modules 30A, 30B (DC or AC power input modules) stacked with each other in the present invention, the power input modules 30A, 30B are electrically coupled to the plurality of power supply devices 40 and jointly and electrically coupled to the back panel 21, and the back panel 21 is provided for the final power output.

Figure 8:
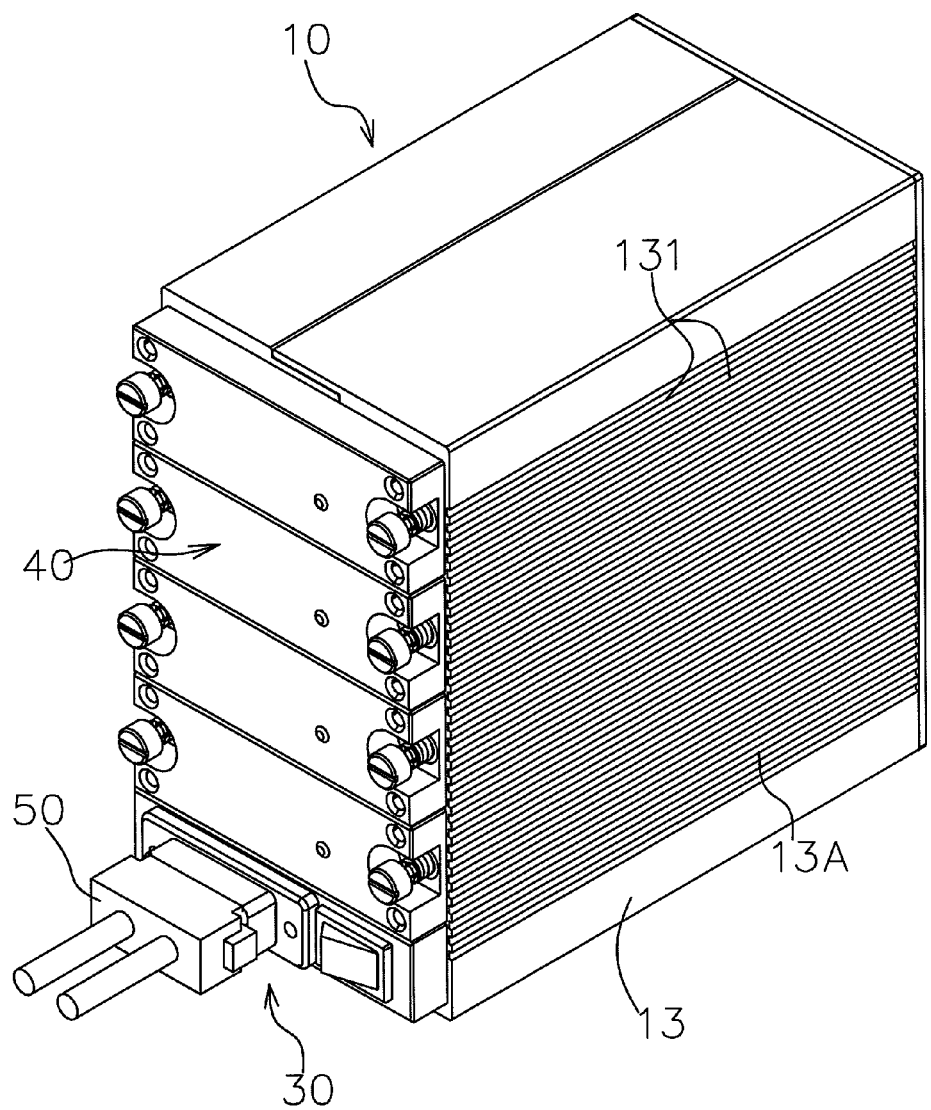
FIG. 8 is a schematic view of a third preferred embodiment of the present invention.

With reference to FIG. 8 for a redundant power supply device in accordance with a third preferred embodiment of the present invention, this embodiment is based on the structure of the first preferred embodiment and further comprises a heat sink 13A installed on the side panel 13 of the chassis 10, and the heat sink 13A includes wavy heat dissipating line grooves 131 formed thereon for improving the heat dissipating effect, while the chassis 10 is made of a metal material (such as an aluminum sheet) having a better heat dissipating performance, and the thermal conductive glue 47 of the present invention is used for attaching the modular printed circuit board 45 closely with the chassis 10 to maximize the thermal conducting efficiency of the present invention, so as to enhance the quality, safety and durability of the application.

In summation of the present invention having a modular power input/output design and a selective swappable application can provide flexible manufacturing, assembling and application to achieve better economic effects and product competitiveness, and the power output can be selected to meet the requirements of connecting various different electric devices for different applications. In addition, the present invention comes with a modular package and a good heat dissipation effect, and thus the heat dissipating efficiency is excellent to assure the quality and safety of using the power supply device.

Obviously, the present invention enhances the prior art and complies with patent application requirements, and thus is duly filed for the patent application.

While the invention has been described by device of specific embodiments, numerous modifications and variations could be made thereto by those generally skilled in the art without departing from the scope and spirit of the invention set forth in the claims.

What is claimed is:

1. A redundant power supply device, particularly a power supply device without installing a heat dissipating fan, comprising;
   a chassis, having at least one power input accommodating space and a plurality of power output accommodating spaces, and the chassis having a height and a width equal to 150+10 mm and 86+10 mm respectively;
   a back panel device, including a back panel, which is a printed circuit board, and the back panel being mounted onto the chassis and having a plurality of back panel connectors disposed on the back panel and at an opposite side of the containing spaces respectively, and said back panel device further includes an output board fixed to the back panel, and the output board includes a plurality of electric output connectors electrically coupled to the back panel or the corresponding back panel connector, and said plurality of electric output connectors are passed through and installed to a plurality of electric connector slots on the output board respectively;
   at least one power input module, installed into the power input accommodating space, and having a power input conversion circuit for providing an external AC-to-DC or DC-to-DC conversion function, and the power input module being electrically connected to the back panel; and
   a plurality of power supply devices, each being installed in the power output accommodating space, and having a power supply connector for connecting the back panel connector;
   thereby, if the external power supply is an AC input, the power input module will be changed to an AC-to-DC module; and if the external power supply is a DC input, the power input module will be changed to a DC-to-DC module, such that an AC or DC power input module can be installed in the power input accommodating space as the power input module for a power input according to an application requirement of an AC or DC input without changing the back panel.

2. The redundant power supply device of claim 1, wherein the chassis includes rails disposed on sides of the containing spaces respectively, and corresponding slide slots disposed on sides of the power supply device respectively.

3. The redundant power supply device of claim 1, wherein the power supply device further includes an upper casing, a lower casing and a modular printed circuit board integrally connected for installing the power supply connector, and the modular printed circuit board includes related electronic components installed thereon, and the modular printed circuit board is packaged by a thermal conductive glue.

4. The redundant power supply device of claim 3, wherein the thermal conductive glue is attached closely with the upper casing and the lower casing.

5. The redundant power supply device of claim 1, further comprising two power input modules, and the chassis having two power input accommodating spaces, and the two power input modules being installed in the two power input accommodating spaces as a power input.

6. The redundant power supply device of claim 5, further comprising 2+1 or less power supply devices, and the power supply devices being installed in the power output accommodating spaces as a power input.

7. The redundant power supply device of claim 1, wherein the power input module and the plurality of power supply devices are electrically coupled to the back panel.

8. The redundant power supply device of claim 1, wherein the chassis includes a side panel, a heat sink formed on the side panel, and wavy heat dissipating line grooves formed on the heat sink.

9. The redundant power supply device of claim 1, wherein the at least one power input module comes with a quantity of one said power input module, and the power supply device comes with a quantity of less than 3+1 said power supply device.

10. The redundant power supply device of claim 1, wherein the external input DC power supply has a voltage of 5V~76V.

11. The redundant power supply device of claim 1, wherein the output DC power supply has a voltage of 3.3V, 5V, +12V or 5VSB.

* * * * *